(12) United States Patent
Basol (10) Patent No.: US 8,323,735 B2
(45) Date of Patent: Dec. 4, 2012

(54) METHOD AND APPARATUS TO FORM SOLAR CELL ABSORBER LAYERS WITH PLANAR SURFACE

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 571 days.

(21) Appl. No.: 12/345,389

(22) Filed: Dec. 29, 2008

(65) Prior Publication Data

US 2009/0162969 A1 Jun. 25, 2009

Related U.S. Application Data (63) Continuation-in-part of application No. 12/334,420, filed on Dec. 12, 2008, which is a continuation-in-part of application No. 12/027,169, filed on Feb. 6, 2008, which is a continuation-in-part of application No. 11/938,679, filed on Nov. 12, 2007, and a continuation-in-part of application No. 11/549,590, filed on Oct. 13, 2006, now abandoned, application No. 12/345,389, which is a continuation-in-part of application No. 12/177,007, filed on Jul. 21, 2008.

(51) Int. Cl.
*C23C 14/00* (2006.01)
*C23C 6/00* (2006.01)

(52) U.S. Cl. ............ 427/255.26; 427/255.23; 427/248.1
(58) Field of Classification Search ............ 427/255.26, 427/255.23, 248.1
See application file for complete search history.

(56) References Cited

U.S. PATENT DOCUMENTS

| | | |
|---|---|---|
| 3,032,890 A | 5/1962 | Brick et al. |
| 4,450,786 A | 5/1984 | Doehler et al. |
| 4,492,181 A | 1/1985 | Ovshinsky et al. |
| 4,581,108 A | 4/1986 | Kapur et al. |
| 4,723,507 A | 2/1988 | Ovshinsky et al. |
| 4,798,660 A | 1/1989 | Ermer et al. |

(Continued)

FOREIGN PATENT DOCUMENTS

DE 10006778 2/2000

(Continued)

OTHER PUBLICATIONS

Abou-Elfotouh, FA, et al., "Studies of the Electrical and Interface Properties of the Metal Contacts to CuInSe$_2$ Single Crystals", *J. Vac. Sci. Technol. A.*, 8(4), Jul./Aug 1990, pp. 3251-3254.

(Continued)

*Primary Examiner* — Kelly M Gambetta
(74) *Attorney, Agent, or Firm* — Pillsbury Winthrop Shaw Pittman LLP (57) ABSTRACT

A method and a system are provided for forming planar absorber layers or structures by planarizing and reacting precursor layers in a reactor. A precursor structure is first formed over the front surface of a foil substrate and then planarized through application of pressure by a smooth surface while heated to a first temperature range to obtain a planar layer. The planar layer may be only partially reacted. The planar layer is further reacted at a second temperature range to form a fully or completely reacted planar absorber layer. The planar absorber layer may include at least one Group IB material, at least one Group IIIA material and at least one Group VIA material. The planar absorber layer may be a Group IBIIIA-VIA compound layer.

26 Claims, 5 Drawing Sheets

U.S. PATENT DOCUMENTS

| | | | |
|---|---|---|---|
| 5,378,639 | A | 1/1995 | Sasaki et al. |
| 5,571,749 | A | 11/1996 | Matsuda et al. |
| 5,578,503 | A | 11/1996 | Karg et al. |
| 5,893,983 | A * | 4/1999 | Konrad et al. ............... 216/91 |
| 6,048,442 | A | 4/2000 | Kushiya et al. |
| 6,092,669 | A | 7/2000 | Kushiya et al. |
| 6,207,219 | B1 | 3/2001 | Ikeya et al. |
| 6,753,272 | B1 | 6/2004 | Lee et al. |
| 7,091,136 | B2 | 8/2006 | Basol et al. |
| 7,259,106 | B2 * | 8/2007 | Jain .............................. 438/737 |
| 7,858,151 | B2 * | 12/2010 | Sager et al. ............. 427/255.34 |
| 2004/0063320 | A1 | 4/2004 | Hollars et al. |
| 2004/0161533 | A1 | 8/2004 | Sawayama et al. |
| 2007/0111367 | A1 | 5/2007 | Basol et al. |

FOREIGN PATENT DOCUMENTS

| | | |
|---|---|---|
| EP | 0782176 | 7/1997 |
| JP | 11-145060 | 5/1999 |

OTHER PUBLICATIONS

Bhattacharya, R.N., et al., "$CuIn_{1-x}Ga_xSe_2$-based Photovoltaic Cells from Electrodeposited Precursor Films", *Solar Energy Mats & Solar Cells*, vol. 76, 2003, pp. 331-337.

Binsma, J.J., et al., "Preparation of Thin $CuInS_2$ Films via a Two Stage Process", *Thin Solid Films*, 97, 1982, pp. 237-243.

Calixto, M.E., et al., "$CuInSe_2$ Thin Films Formed by Selenization of Cu-In Precursors", *J. of Mats. Sci.*, 33, 1998, pp. 339-345.

Dey, S., et al., "Platinum Group Metal Chalcogenides", *Platinum Metals Rev.*, 48(1), 2004, pp. 16-29.

Fernandez, et al., "Electrodeposited and Selenized ($CuInSe_2$) (CIS) Thin Films for Photovoltaic Applications", *Solar Energy Materials and Solar Cells*,52, 1998, pp. 423-431.

Friedfeld, R., et al., "Electrodeposition of $CuIn_xGa_1-xSe_2$ Thin Films", *Solar Energy Mats. & Solar Cells*, 58, 1999, pp. 375-385.

Fritz, H.P., et al., "A New Electrochemical Method for Selenization of Stacked CuIn Layers and Preparation of $CuInSe_2$ by Thermal Annealing", *Thin Solid Films*, 247, 1994, pp. 129-133.

Gabor, et al., "$CuInSe_2$ Thin Film Formation by Rapid Annealing of the Elemental Precursor", *AIP Conf. Proc.*, No. 268, *Photovoltaic Advanced Research and Dev. Project*, 1992, pp. 236-242.

Ganchev, M., et al., "Preparation of $Cu(In,Ga)Se_2$ Layers by Selenization of Electrodeposited Cu-In-Ga Precursors", *Thin Solid Films*, 511-512, 2006, pp. 325-327.

Ghosh, B., et al., "A Novel Back-Contacting Technology for $CuInSe_2$ Thin Films", *Semiconduct. Sci. Tech.*, 11, 1996, pp. 1358-1362.

Grindle, S.P., et al., "Preparation and Properties of $CuInS_2$ Think Films Produced by Exposing rf-Sputtered Cu-In Films to an $H_2S$ Atmosphere", *Appl. Phys. Lett*, 35(1) Jul. 1, 1979, pp. 24-26.

Guillen, C., et al., "New Approaches to Obtain $CuIn_{1-x}Ga_xSe_2$ Thin Films by Combining Electrodeposited and Evaporated Precursors", *Thin Solid Films*, 323, 1998, pp. 93-98.

Guillen, C.,et al., "$CuInSe_2$ Thin Films Obtained by a Novel Electrodeposition and Sputtering Combined Method," *Vacuum*, 58, 2000, pp. 594-601.

Gupta, A., et al., "$CuInS_2$ Films Prepared by Sulfurization of Electroless Deposited Cu-In Alloy", *Solar Energy Mats.*, 18, 1988, pp. 1-8.

Huang, C.J., et al., "formation of $CuInSe_2$ Thin Films on Flexible Substrates by Electrodeposition (ED) Technique", *Solar Energy Mats. & Solar Cells*, 82, 2004, pp. 553-565.

Kadam, A., at al., "Study of Molybdenum Back Contact Layer to Achieve Adherent and Efficient CIGS2 Absorber Thin-Film Solar Cells", *J. Vac. Sci. Tech. A.*, 23(4), Jul./Aug. 2005, pp. 1197-1201.

Kampmann, A., et al., "Electrodeposition of CIGS on Metal Substrates", *Mat. Res. Soc. Symp. Proc.*, 763, 2003, pp. B8.5.1-B8.5.6.

Kapur, V.K., et al., "Low Cost Thin Film Chalcopyrite Solar Cells", *IEEE*, 1985, p. 1429-1432.

Kapur, V.K., et al., "Low Cost Methods for the Production of Semiconductor Films for $CuInSe_2$/CdS Solar Cells", *Solar Cells*, 21, 1987, pp. 65-72.

Kerr, et al., "Rapid Thermal Processing of CIS Precursors", *IEEE*, 2002, pp. 676 -679.

Kim, et al., "Preparation of $CuInSe_2$ Thin Films Using Electrodeposited In/Cu Metallic Layer", *First WCPEC*, Dec. 5-9, 1994, Hawaii, *IEEE*, pp. 202-205.

Kumar, et al., "Properties of $CuInSe_2$ Films Prepared by the Rapid Thermal Annealing Technique", *Thin Solid Films*, 223, 1993, pp. 109-113.

Lokhande, C., et al., "Preparation of $CuInSe_2$ and $CuInS_2$ Films by Reactive Annealing in $H_2$ $Se_2$ or $H_2$ S", *Solar Cells*,, 21, 1987, pp. 215-224.

Malmstrom, J., et al., "Enhanced Back Reflectance and Quantum Efficiency in $Cu(In,Ga)$ $H_2$ $Se_2$ Thin Film Solar Cells with ZrN Back Reflector", *Appl. Phys. Letts.*, 85(13), Sep. 27, 2004, pp. 2634-2636.

Mooney, et al., "The Formation of $CuInSe_2$ Thin films by Rapid Thermal Processing", *Solar Cells*, vol. 30, 1991, p. 69-77.

Moons, E., et al., "Ohmic Contacts to P-$CuInSe_2$ Crystals", *J. of Electron. Mats.*, 22(3), 1993, pp. 275-280.

Nelson, A., et al., "Formation of Schottky Barrier Height of Au Contacts to $CuInSe_2$", *J. Vac. Sci. Technol. A.*, 9(3), May/Jun. 1991, pp. 978-982.

Winkler, M., et al. "CISCuT absorber layers—the present model of thin film growth", Thin Solid Films 387 (2001) p. 86-88.

Abedin, et al., "Electrodeposition of Selenium, Indium and Copper in an Air and water Stable Ionic Liquid at Variable Temperatures", *Electrochimica Acta*, vol. 52, pp. 2746-2754, 2007.

Basol, et al., "Cu(In, Ga)Se2 Thin Films and Solar Cells Prepared by Selenization of Metallic Precursors", *J. Vacuum Sci. and Tech. A.*, vol. 14, pp. 2251-2256, 1996.

Chen, et al., "Cu/In Deposited at Room Temperature Morphology, Phases and Reactions", *Solar Cells*, vol. 30, pp. 451-458, 1991.

Pendorff, et al., "CuInS2 Thin Film Formation on a Cu Tape Substrate for Photovoltaic Applications", *Solar Energy Mats. And Solar Cells*, vol. 53, pp. 285-298, 1998.

Probst, et al., MRS Symposium Proc., vol. 426, pp. 165, 1996.

Valderrama, et al., "Electrodeposition of Indium onto Mo/Cu for the Deposition of Cu(In,Ga)Se2 Thin Films", *Electrochimica Acta*, vol. 53, pp. 3714-3721, 2008.

Zank, et al., "Electrochemical Copeposition of Indium and Gallium for Chalocopyrite Solar Cells", *Thin Solid Films*, vol. 286, pp. 259-263, 1996.

European Search Report issued Dec. 15, 2010 in Application No. EP 09708293.

European Search Report issued May 19, 2011 in Application No. EP 07872342.

International Search Report issued Mar. 16, 2009 in PCT/US2009/32418.

* cited by examiner

PRIOR ART

Figure 1

PRIOR ART

Figure 2A

PRIOR ART

Figure 2B

PRIOR ART

METHOD AND APPARATUS TO FORM SOLAR CELL ABSORBER LAYERS WITH PLANAR SURFACE

The present invention is a continuation-in-part ("CIP") of and claims priority to U.S. application Ser. No. 12/334,420 filed Dec. 12, 2008, entitled "REACTOR TO FROM SOLAR CELL ABSORBERS", which is a continuation-in-part of U.S. patent application Ser. No. 12/027,169, filed Feb. 6, 2008, entitled "Reel-To-Reel Reaction of a Precursor Film to Form Solar Cell Absorber," which is a continuation-in-part and claims priority to U.S. patent application Ser. No. 11/938,679, filed Nov. 12, 2007 entitled "Reel-To-Reel Reaction Of Precursor Film To Form A Solar Cell Absorber" and U.S. Utility application Ser. No. 11/549,590 filed Oct. 13, 2006 now abandoned entitled "Method and Apparatus For Converting Precursor Layers Into Photovoltaic Absorbers"; the present invention is also a continuation-in-part ("CIP") of and claims priority to U.S. application Ser. No. 12/177,007 filed Jul. 21, 2008, entitled "METHOD AND APPARATUS TO FORM THIN LAYERS OF PHOTOVOLTAIC ABSORBERS"; the present invention is also a continuation-in-part ("CIP") of and claims priority to U.S. application Ser. No. 12/027,169 filed Feb. 6, 2008, entitled "REEL-TO-REEL REACTION OF A PRECURSOR FILM TO FORM SOLAR CELL ABSORBER", which is a CIP of U.S. patent application Ser. No. 11/938,679, filed Nov. 12, 2007, entitled "REEL TO REEL REACTION OF PRECURSOR FILM TO FORM SOLAR CELL ABSORBER", which is a CIP of U.S. patent application Ser. No. 11/549,590 filed Oct. 13, 2006, entitled "METHOD AND APPARATUS FOR CONVERTING PRECURSOR LAYERS INTO PHOTOVOLTAIC ABSORBERS"; the present invention is also a continuation-in-part ("CIP") of and claims priority to U.S. application Ser. No. 11/938,679 filed Nov. 12, 2007, entitled "REEL TO REEL REACTION OF PRECURSOR FILM TO FORM SOLAR CELL ABSORBER", which is a CIP of U.S. patent application Ser. No. 11/549,590, filed Oct. 13, 2006, entitled "METHOD AND APPARATUS FOR CONVERTING PRECURSOR LAYERS INTO PHOTOVOLTAIC ABSORBERS"; and the present invention is also a continuation-in-part ("CIP") of and claims priority to U.S. application Ser. No. 11/549,590 filed Oct. 13, 2006, entitled "METHOD AND APPARATUS FOR CONVERTING PRECURSOR LAYERS INTO PHOTOVOLTAIC ABSORBERS"; all of which are expressly incorporated herein by reference in their entirety.

BACKGROUND

1. Field of the Invention

This invention relates to methods and apparatus to prepare high quality thin film semiconductor absorber layers for manufacturing solar cells.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%.

Figure 1:
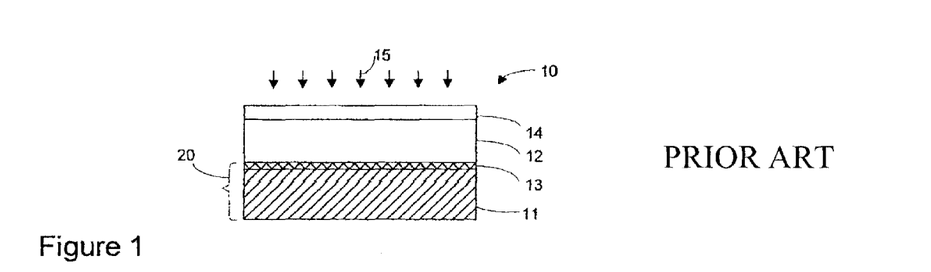
FIG. 1 is a schematic view of a prior art solar cell structure.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which includes a material in the family of $Cu(In,Ga,Al)(S,Se,Te)_2$, is grown over a conductive layer 13 or contact layer, which is previously deposited on the substrate 11 and which acts as the electrical contact to the device. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) or a grid pattern may also be deposited over the transparent layer 14 to reduce the effective series resistance of the device. A variety of materials, deposited by a variety of methods, can be used to provide the various layers of the device shown in FIG. 1. It should be noted that although the chemical formula for a CIGS(S) layer is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

One technique employed for growing $Cu(In,Ga)(S,Se)_2$ type compound thin films for solar cell applications is a two-stage process where at least two ingredients or elements or components of the $Cu(In,Ga)(S,Se)_2$ material are first deposited onto a substrate, and then reacted with S and/or Se in a high temperature annealing process. For example, for $CuInSe_2$ or CIS film growth, thin layers of Cu and In are first deposited on a substrate and then this stacked precursor structure is reacted with Se at elevated temperature to form CIS. If the reaction atmosphere also contains sulfur, then a CuIn(S, Se)$_2$ or CIS(S) layer can be grown. Addition of Ga in the precursor structure, i.e. use of a Cu/In/Ga stacked film precursor, allows the growth of a $Cu(In,Ga)(S,Se)_2$ or CIGS(S) absorber.

Sputtering and evaporation techniques have been used in prior art approaches to deposit the layers containing the Group IB and Group IIIA components of the precursor stacks. In the case of $CuInSe_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method comprising sputter-depositing a stacked precursor film comprising a Cu—Ga alloy layer and an In layer to form a Cu—Ga/In stack on a metallic back electrode layer and then reacting this precursor stack film with one of Se and S to form the absorber layer. Electron beam evaporated In/Cu/Ga stacks have also been prepared and then reacted with $H_2Se$ to form CIGS (see, for example, B. Basol et al., J. Vacuum Science and Technology A, 14 (1996) 2251). Precursor films comprising Cu, In, Ga and optionally a Group VIA material may also be deposited on a base using techniques such as screen printing, nano-ink deposition, etc.

One prior art method described in U.S. Pat. No. 4,581,108 utilizes a low cost electrodeposition approach for metallic precursor preparation. In this method a Cu layer is first electrodeposited on a substrate. This is then followed by electrodeposition of an In layer and heating of the deposited Cu/In stack in a reactive atmosphere containing Se to form CIS. Various other researchers have reported In electroplating approaches for the purpose of obtaining In-containing precursor structures later to be converted into CIS absorber films through reaction with Se (see for example, Lokhande and Hodes, Solar Cells, 21 (1987) 215; Fritz and Chatziagorastou, Thin Solid Films, 247 (1994) 129; Kim et al, Proceedings of the $1^{st}$ World Conf. on Photovoltaic Energy Conversion, 1994, p. 202; Calixto and Sebastian, J. Materials Science, 33 (1998) 339; Abedin et al., Electrochemica Acta, 52 (2007) 2746, and, Valderrama et al., Electrochemica Acta, 53 (2008) 3714).

In a thin film solar cell employing a Group IBIIIAVIA compound absorber such as CIS or CIGS, the solar cell efficiency is a strong function of the molar ratio of the IB element(s) to IIIA element(s), i.e. the IB/IIIA molar ratio. If there are more than one Group IIIA materials in the composition, the relative amounts or molar ratios of these IIIA elements also affect the solar cell efficiency and other properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at or below 1.0. For ratios higher than 1.0, a low resistance copper selenide phase, which may introduce electrical shorts within the solar cells may form. Increasing the Ga/(Ga+In) molar ratio, on the other hand, widens the optical bandgap of the absorber layer, resulting in increased open circuit voltage and decreased short circuit current. A CIGS material with a Ga/(Ga+In) molar ratio higher than about 0.3 is electronically poor. It is for this reason that the sunlight-to-electricity conversion efficiency of a CIGS type solar cell first increases as the Ga/(Ga+In) molar ratio in the absorber is increased from 0 to 0.3, and then the efficiency starts to decrease as the molar ratio is further increased towards 1.

In light of the above discussion, it should be appreciated that if any layer in a CIGS(S) precursor stack has non-uniform thickness, such non-uniformity produces micro-scale compositional non-uniformities. If, for example, the micro-structure of an In film or an In—Ga alloy film deposited on a planar Cu or Cu—Ga alloy layer is rough and includes protrusions and valleys or discontinuities, the localized micro-scale Ga/(In+Ga) ratio at the protrusions would be lower than the Ga/(In+Ga) ratio at the valleys. Furthermore, the Cu/(In+Ga) molar ratio would be different at the protrusions and valleys. This kind of micro-scale non-uniformity would yield a CIGS(S) absorber with non-uniform electrical and optical properties after reaction of the precursor stack with Se and/or S.

Low melting Group IIIA materials such as In and Ga have high surface tension and they often grow in the form of islands or droplets when deposited on a substrate surface in thin film form. This behavior has been observed in prior work carried out on electroplated In films (see for example, Chen et al., Solar Cells, 30 (1991) 451; Kim et al, Proceedings of the $1^{st}$ World Conf. on Photovoltaic Energy Conversion, 1994, p. 202; Calixto and Sebastian, J. Materials Science, 33 (1998) 339; Abedin et al., Electrochemica Acta, 52 (2007) 2746, and, Valderrama et al., Electrochemica Acta, 53 (2008) 3714), electroplated In—Ga alloy films (see for example Zank et al., Thin Solid Films, 286 (1996) 259) as well as in e-beam evaporated In films (Chen et al, Solar Cells, 30 (1991) 451). As stated before, lack of micro-scale planarity in In and/or Ga-rich layers presents problems for application of such non-uniform layers to thin film solar cell manufacturing.

Figure 2A:
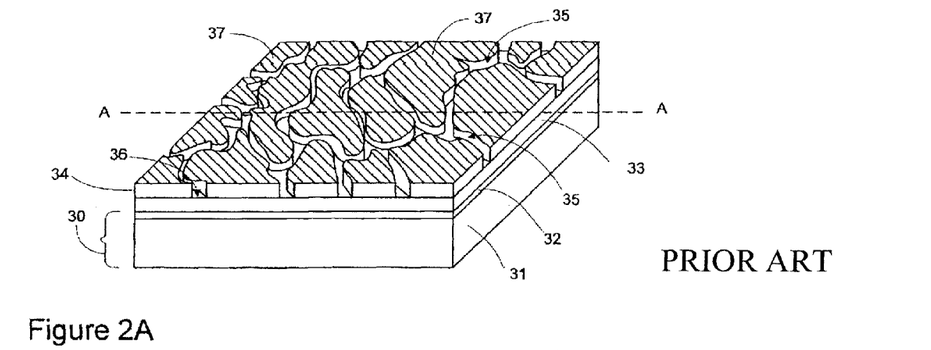
FIG. 2A is a perspective top view of a prior art precursor structure formed by electroplating a sub-micron thick In layer on a sub-layer.
Figure 2B:
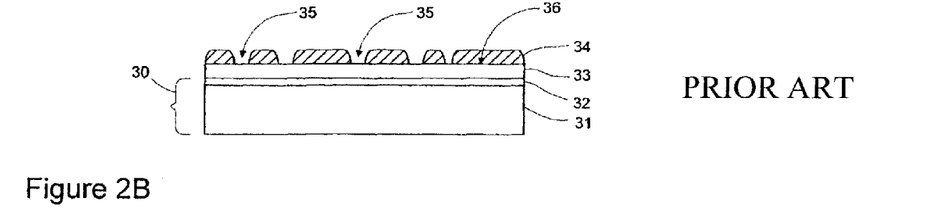
FIG. 2B is a cross-sectional view of the structure of FIG. 2A taken along the line AA.
Figure 3:
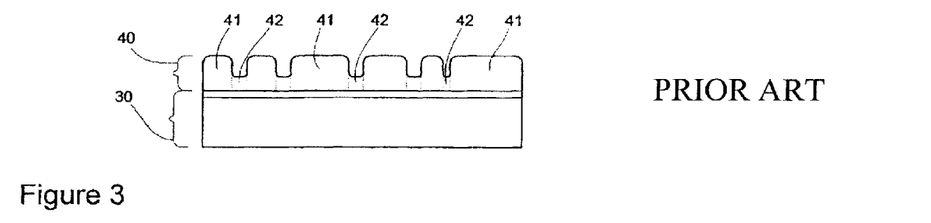
FIG. 3 is a CIGS layer formed after reaction of the structure of FIG. 2B with Se.

FIGS. 2A-2B schematically show a prior art structure in perspective and side views, respectively. The structure includes a typical prior art In layer 37, with sub-micron thickness which may be electrodeposited on a surface 36 of an under-layer 33. The under-layer 33 is formed over a base 30 having a substrate 31 and a contact layer 32. The under-layer 33 may, for example, include Cu and Ga and be formed on the contact layer 32. As can be seen from FIGS. 2A and 2B, the sub-micron thick In layer 37 is discontinuous and it includes islands 34 of In, separated by valleys 35 through which the surface 36 of the under-layer 33 is exposed. The width of the islands may be in the range of 500-5000 nm. Although the top surface of the islands in FIG. 2B is shown as relatively planar, in practice the heights of the individual islands may be different from each other and their top surfaces may be irregular instead of flat (see for example FIG. 4A). In any case, if the structure of FIGS. 2A and 2B is reacted with a Group VIA material such as Se, a CIGS solar cell absorber 40 may be formed on the base 30 as shown in FIG. 3. The CIGS solar cell absorber 40 has compositional non-uniformities caused by the morphological non-uniformity of the sub-micron thick In layer 37. Accordingly, the CIGS solar cell absorber 40 has a first region 41 and a second region 42. The first region 41 corresponds to the islands 34 of In of the structure of FIG. 2A, and is an In-rich, Ga-poor region. The second region 42 corresponds to the valleys 35 of the structure of FIG. 2A, and is an In-poor, Ga-rich region. Furthermore, the Cu(In+Ga) molar ratio in the first region 41 is lower than the Cu(In+Ga) molar ratio in the second region 42. It should be appreciated that when a solar cell is fabricated on the CIGS solar cell absorber 40, the efficiency of the solar cell would be determined by both the first region 41 and the second region 42. The solar cell would act like two separate solar cells, one made on the first region 41 and the other made on the second region 42 and then interconnected in parallel. Since the Ga/(Ga+In) as well as the Cu/(In+Ga) molar ratios in the two regions are widely different the quality of the separate solar cells on these regions would also be different. The quality of the overall solar cell would then suffer from the poor I-V characteristics of the separate solar cells formed on either one of the first and second regions.

In addition to its compositional uniformity, both in micro and macro levels, the surface quality of the thin film semiconductors also influence the performance of solar cells fabricated on them. For example, in the device 10 or solar cell structure depicted in FIG. 1, as the surface of the absorber film 12 is made smoother, the active area of the rectifying junction formed between the transparent layer 14 and the absorber film 12 gets smaller. Reduced junction area in thin film solar cells such as the device 10 of FIG. 1 typically results in higher open circuit voltages and higher conversion efficiencies. The surface of a CIGS absorber layer grown over a substrate by a co-deposition technique, such as a co-evaporation approach, can be made mirror-finish. This is because in co-deposition approaches Cu, In, Ga and Se species are delivered onto a heated base at relatively low rates of 1-10 nm/second and they react on the surface of the contact layer of the base monolayer at a time. This yields an extremely smooth surface with a roughness in the range of 1-20 nm depending upon the nature of the substrate or contact layer surface. In two-stage processes, on the other hand, a relatively thick (e.g. 500-2000 nm) precursor layer is first deposited over the base which may be at a low temperature such as at room temperature, and then the precursor layer is heated to temperatures in the 400-600° C. range to react and convert it into a solar cell absorber layer. During the reaction of such relatively thick precursor layers, the elemental and alloy species, especially the low melting metallic species (such as In and Ga) present in the precursor layer display mobility, i.e. they melt, react and move in molecular scale. Different reaction rates between the Group VIA materials and the Cu, In and Ga species, and the volume expansion of the original precursor layer associated with such reaction also promote nano scale physical changes in the CIGS layer during its formation. As a result, CIGS absorber layers obtained by two-stage processes employing metallic precursor films typically display rougher surfaces (e.g. a surface roughness of about 50 nm or higher, even as high as 500 nm) than the CIGS absorber layers grown by the co-deposition techniques. This is one reason why solar cells made on co-evaporated CIGS layers yield higher efficiency devices than those fabricated on layers grown by the two-stage approaches.

As can be seen from the foregoing discussion there is a need to develop approaches that provide substantially planar precursor structures that can be converted into compositionally uniform semiconductor films. Also there is a need for methods and tools that would reduce surface roughness of thin film solar cell absorber layers.

SUMMARY OF THE INVENTION

The present invention relates to methods and apparatus to prepare good quality precursor films that are converted into solar cell absorbers.

In one aspect, there is provided a method of forming a thin film solar cell absorber layer, comprising providing a base having a front surface and a back surface; depositing a precursor layer over the front surface of the base, wherein the precursor layer includes metallic species comprising at least one Group IB material and at least one Group IIIA material; converting the precursor layer into a planar layer during a planarization period by applying force onto the precursor layer by a planarization apparatus at a first temperature range within a first process section of a reactor; and reacting the planar layer at a second temperature range for a transformation period within a second process section that is different from the first process section of the reactor to transform the planar layer into a planar Group IBIIIAVIA compound layer, the second temperature range being greater than the first temperature range.

In another aspect, there is provided a method of forming a thin film solar cell absorber layer on a continuous base having a front surface over which a precursor layer is deposited and a back surface, the method comprising; feeding a portion of the continuous base into an elongated reactor through an entry opening; converting a segment of the precursor layer over the front surface of the portion of the continuous base into a planar layer segment during a planarization period by a planarization apparatus at a first temperature range within a first process section of the elongated reactor as the portion is moved through the first process section; and, reacting the planar layer segment at a second temperature range for a transformation period within a second process section that is different from and adjacent to the first process section of the elongated reactor to transform the planar layer segment into a planar compound layer segment as the portion is moved through the second process section.

In a further aspect, there is provided q system for forming planar absorber layers for manufacturing solar cells over a front surface of a continuous base, the continuous base including the front surface and a back surface, the system comprising: an elongated reactor with a process gap defined by a peripheral wall of the reactor, the process gap including an entrance opening to a low temperature section, an exit opening to a cooling section, and a high temperature section between the low temperature section and the cooling section; a moving mechanism for supplying the continuous base into the process gap through the entrance opening and moving it through the low temperature section, the high temperature section, the cooling section and the exit opening, the front surface of the base including a precursor layer; and at least one planarization apparatus placed in the low temperature section of the process gap, the at least one planarization apparatus having a smooth surface that is adapted to planarize the precursor layer by applying pressure onto the precursor layer.

These and other aspects and advantages, among others, are described further hereinbelow.

DETAILED DESCRIPTION OF THE INVENTION

The present invention provides a method for forming a high quality Group IBIIIAVIA semiconductor layer on a base that can be used for thin film solar cell fabrication. Accordingly, the method forms a precursor layer or structure on the base, the precursor structure comprising at least one Group IB material and at least one Group IIIA material, preferably in substantially unreacted metallic form. The precursor structure may additionally contain a Group VIA material, and may also contain a plurality of different layers, as explained hereinafter, and as such it is understood that that the phrase precursor structure or "precursor layer" can contain a single layer or a plurality of layers. The precursor structure may be deposited by a variety of methods including, but not limited to electrodeposition, screen printing, various ink and/or slurry deposition approaches such as doctor-blading, gravure coating, roll coating, etc. The precursor structure or any or all of the layers within the precursor structure is subjected to a planarization step to form a planarized precursor structure. After the planarization step there may be additional process steps to deposit other ingredients over the planarized precursor structure to form a final precursor film. In some cases there is no need for additional process steps after the planarization step, i.e. the planarization is applied to the completed precursor structure to form the final precursor film, which, in this case is a planarized precursor structure. The final precursor film or the planarized precursor structure is subjected to a high temperature process, typically at a maximum temperature range of 400-600° C. and preferably in presence of a Group VIA material to convert it into a Group IBIIIAVIA compound layer, which may be used as a thin film solar cell absorber layer. The method and apparatus of the present invention will now be described by an example the formation of a $Cu(In,Ga)Se_2$ or CIGS solar cell absorber on a base. It will be appreciated that the invention is also applicable to the formation of other Group IBIIIAVIA compound films comprising other Group IB materials such as Ag, other Group IIIA materials such as Al and Tl, and other Group VIA materials such as S and Te. It should be noted that the base over which the precursor structure is formed may include a rigid or a flexible substrate. In an embodiment where the base includes a flexible substrate and a contact layer thereover, the combination of the base and a precursor structure formed over the contact layer can be together referred to as a flexible stack.

Figure 4A:
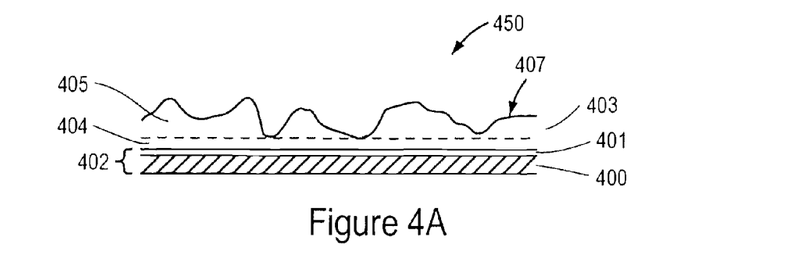
FIG. 4A shows a precursor structure on a base, with the precursor structure having a non-planar surface.

FIG. 4A shows an exemplary structure 450 including a type I precursor structure 403 deposited over a base 402. Type I precursor structure in this example is a substantially metallic layer. Out of the constituent elements of a Group IBIIIAVIA compound, the Group IB materials (such as Cu) and the Group IIIA materials (such as In and Ga) are metals. The Group VIA materials, on the other hand are either semi-metals (such as Se and Te) or non-metals (such as S). Therefore, the type I precursor structure which is substantially metallic, comprises Group IB and Group IIIA metals as will be discussed next. Any other materials that may be present in the type I precursor structure are present in amounts less than about 10 molar percent, preferably less than about 5 molar percent.

The base 402 may comprise a substrate 400 and an optional contact layer 401. The substrate 400 may be a metallic or polymeric substrate, preferably a 25-75 micrometer thick flexible metallic foil such as a stainless steel foil or an aluminum alloy foil or a high temperature flexible polymeric material foil such as an electrically insulating polyimide web. The contact layer 401 is a conductive layer comprising a material that makes ohmic contact to Group IBIIIAVIA compounds. Such materials include but are not limited to Mo, W, Ta, and their nitrides and materials such as Ru, Ir, Os.

The type I precursor structure 403 deposited or formed over the contact layer 401 includes at least Cu and one of In and Ga. Preferably the type I precursor structure 403 includes all of Cu, In and Ga. For example, the type I precursor structure 403 may comprise a stack of a Cu-rich layer 404, which is shown by dotted lines, and an In and/or Ga rich layer 405. Various techniques may be used to deposit the type I precursor structure 403 on the base 402. Such techniques include but are not limited to evaporation, sputtering, ink deposition and electrodeposition. The preferred technique is electrodeposition. It should be noted that the nature of the type I precursor structure 403 may be changed widely. For example the type I precursor structure 403 may be a single Cu—In—Ga layer, or a stack of multiple layers such as a Cu/In/Ga stack, a Cu/Ga/In stack, a Cu—In/Ga stack, a Cu—Ga/In stack, a Cu/In—Ga stack and the like, where Cu—In, Cu—Ga, In—Ga and Cu—In—Ga refer to mixtures or alloys of Cu and In, Cu and Ga, In and Ga and Cu and In and Ga, respectively. As shown in FIG. 4A the top surface 407 of the type I precursor structure 403 is rough, i.e. non-planar. The average thickness of an exemplary type I precursor structure may be in the range of 400-1000 nm, preferably in the range of 500-800 nm. As depicted in FIG. 4A the Cu-rich layer 404 is relatively easy to deposit in a planar manner. Evaporation, sputtering, electroplating are examples of techniques that yield smooth Cu rich layers, such as pure Cu layers, with small grains and smooth surface. Indium and/or Ga rich layers, such as pure In or Ga layers or In—Ga alloy layers on the other hand, are more difficult to obtain in a planar manner as discussed before. A Group VIA material such as Se and a dopant such as Na may also be included in the type I precursor structure. This inclusion may be achieved in the form of nano size particles or through partial reaction with any of Cu, In and Ga with The Group VIA material and/or the dopant. But, as stated before, such inclusion is limited to at most 10 molar percent, preferably less than 5 molar percent.

Figure 4B:
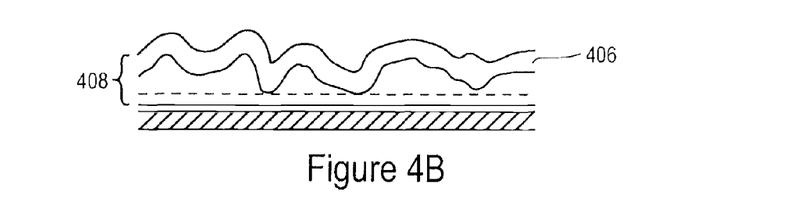
FIG. 4B shows another precursor structure having a non-planar surface.

FIG. 4B shows an exemplary precursor structure referred to as a type II precursor structure 408 that includes a Group VIA-rich material portion such as a Se-rich layer 406. The type II precursor structure 408 may, for example, be obtained by depositing a Se film over the type I precursor structure 403 of FIG. 4A.

Figure 4C:
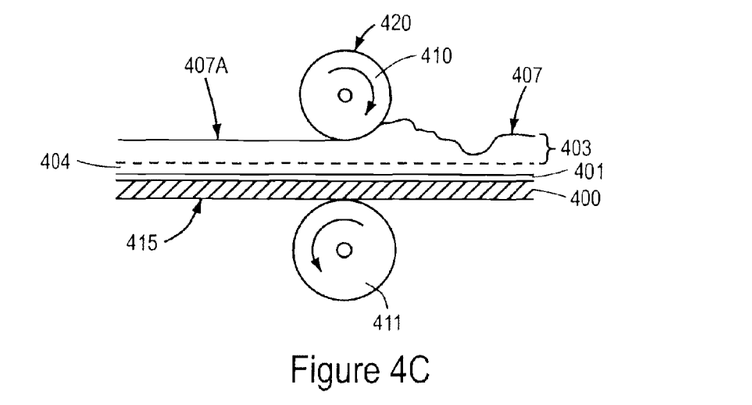
FIG. 4C shows the planarization of the precursor structure of FIG. 4A.

FIG. 4C shows the planarization process carried out on the precursor structure of FIG. 4A, i.e. the type I precursor structure 403. As can be seen from this figure, planarization is achieved by applying pressure to the top surface 407 of the type I precursor structure 403, preferably using rollers. Although the preferred method is to use two rollers, an upper roller 410 and a lower roller 411 as shown in the figure, it is also possible to support the bottom surface 415 of the substrate 400 on a flat surface (not shown) or a support structure and to use only the upper roller 410 for planarization of the type I precursor structure 403. As the upper roller 410 rolls over the top surface 407 of the type I precursor structure 403 it flattens it yielding a planarized type I precursor structure with a planar surface 407A. The surface 420 of the upper roller 410 is mirror finished, preferably to an average surface roughness of less than or equal to 50 nm, more preferably to less than or equal to 20 nm to yield a mirror finished planar surface 407A. It should be noted that there are other means of achieving planarization also. In one approach, for example, a flexible flat sheet (not shown) may be placed over the top surface 407 of the type I precursor structure 403. The force by the upper roller 410 may then be applied to the flat sheet which, in turn, is pushed on the top surface 407 of the type I precursor structure 403, flattening it. In this case the surface quality of the upper roller 410 may not be as important. Instead, the average roughness value of the surface of the flat sheet facing the top surface 407 of the type I precursor structure 403 needs to be less than or equal to 50 nm, preferably less than or equal to 20 nm. There are many polymeric sheets which can be used as the flat sheet. These include but are not limited to Mylar sheets, Teflon-based sheets, polyimide-based sheets, high density polyethylene sheets, polypropylene sheets, polycarbonate sheets, etc. The flat sheet may have a thickness range of 25-150 micrometers. In addition to inserting the flat sheet between the surface 420 of the upper roller 410 and the top surface 407 of the type I precursor structure 403, a second flat sheet may also be inserted between the lower roller 411 and the bottom surface 415 of the substrate 400. This way the forces applied by the upper roller 410 and the lower roller 411 are cushioned by the flat sheet and the second flat sheet, and more uniformly applied to the type I precursor structure 403. Such planarization or flattening methods may be applied in a roll-to-roll manner to substrates and precursor structures which may be in the form of long and flexible web.

It should be noted that the presence of In and Ga in metallic form within the type I precursor structure 403 facilitates the planarization process since these materials are pliable or malleable and therefore they may be efficiently flattened. During flattening, the high peaks of the type I precursor structure 403 get pushed down by the force of the rollers and the material slips horizontally to fill in the valleys in the type I precursor structure 403.

The planarization process may be carried out at room temperature or at an elevated temperature. Force applied from the upper roller 410 onto the top surface 407 may be in the range of a few kilograms to a few tons. Preferably, the force applied (per 10 cm section) may be in the range of 100-1000 kg. As the temperature of the process during planarization is increased from room temperature towards the melting temperature of In, which is about 156° C., the applied force may be reduced since the type I precursor structure 403 becomes softer. A preferred range of process temperatures for the planarization step is 20-150° C. The heat may be applied to the process by various means such as heating the substrate or heating the roll(s), or both, however, the preferred method is to use heated rollers for this purpose. Another method is to carry out the rolling process in flowing heated water to soften the type I precursor structure 403 and at the same time to keep its top surface as well as the surface 420 of the upper roller 410 clean and free from particles, which, if present would introduce defects into the type I precursor structure 403 during planarization, mostly in the form of embedded particles. As explained before, the rollers, especially the upper roller 410 should have a smooth surface. The average roughness of the roller surface 420 may be less than 50 nm, preferably less than 20 nm to yield a substantially defect free planar surface 407A. The rollers may be made of various materials including metals, rubbers, plastics, glass and ceramics. The surface of the rollers may be coated with a release layer that does not allow sticking of In and Ga to the surface of the roller. In other words the adhesion strength of the precursor structure materials to the contact layer 401 needs to be higher than their adhesion strength to the roller surface 420.

Figure 4D:
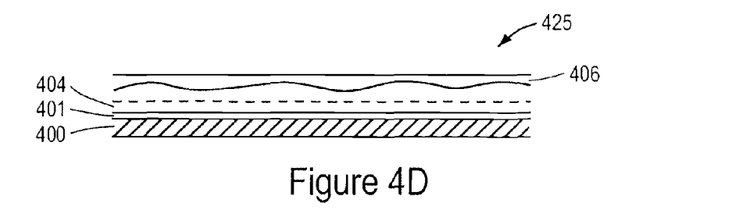
FIG. 4D shows the planarization of the precursor structure of FIG. 4B.

FIG. 4D shows the planarized type II precursor structure 425 which is obtained after planarization of the type II precursor structure 408 depicted in FIG. 4B. In this case the Se-containing layer 406 is pressed into the underlying metallic film and flattens it. Carrying out the rolling and planarization step at a temperature in the range of 50-200° C. may also cause crystallization of the Se-containing layer and some chemical mixing between the Se-containing layer and the underlying metallic film. This may improve the quality of the CIGS layer obtained from the planarized type II precursor structure. All aspects of the invention explained in relation to FIGS. 4A and 4C and in relation to the planarization of the type I precursor structure 403 are also applicable to the type II precursor structure 408 of FIG. 4B and the planarized type II precursor structure 425 depicted in FIG. 4D. These details will not be repeated here.

Figure 5:
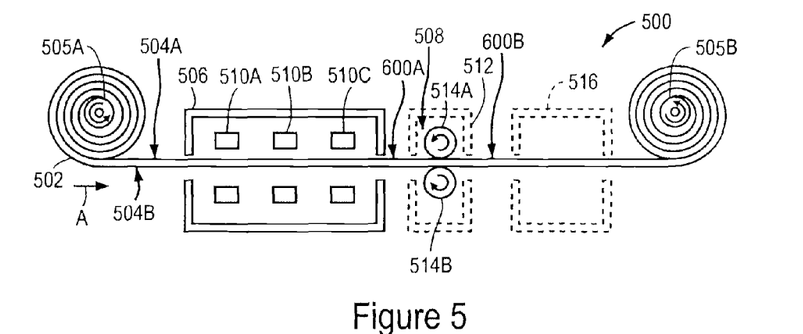
FIG. 5 shows an exemplary system to carry out an embodiment of the invention.

FIG. 5 shows a roll-to-roll or reel-to-reel system 500 of the present invention to perform the process of the present invention on a continuous flexible workpiece 502. The continuous workpiece 502 may comprise a base including a flexible substrate, such as a metallic foil or a polymeric foil, and a contact layer formed on a front surface of the substrate. In the roll to roll processes of the present invention, the above described planarized precursor structures may be formed over the front surface 504A of the continuous workpiece 502 as the continuous workpiece is advanced through the system 500 by a moving mechanism (not shown). Alternately, as a precursor structure is formed using the system 500, one or more of the layers within the precursor structure may be planarized. During the process, the moving mechanism feeds the continuous workpiece 502 into the system in the direction of arrow 'A' from a supply spool 505A. The processed continuous flexible workpiece is taken up and wrapped around a receiving spool 505B. In one embodiment, the system 500 comprises at least a process station 506 and at least one planarization apparatus 508.

The process station 506 may include one or more deposition units, such as deposition units 510A, 510B and 510C to form a precursor structure 600A. The deposited precursor structure on the surface 504A of the continuous workpiece 502 may be the same as the precursor structures shown in FIG. 4A or 4B. For clarity, in FIG. 5, the deposited precursor structure is denoted with the reference numeral 600A which points at a portion of the continuous workpiece 502. In this configuration, for example, a Group IB material such as Cu may be deposited in the deposition unit 510A; a Group IIIA material such as Ga and/or In may be deposited in the deposition unit 510B; and a Group VIA material such as Se may be deposited in the deposition unit 510C. The system 500 may have more than one planarization apparatus 508. The exemplary configuration shown in FIG. 5 forms a precursor structure using the deposition units 510A, 510B and 510C, and planarizes the precursor structure using the planarization apparatus 508 to form a planarized precursor structure. It should be noted that the planarization apparatus 508 may be placed in the process station 506 to planarize any of the layers deposited in any of the deposition units. Alternately, more than one planarization apparatus may be employed to planarize more than one layer deposited in the deposition units. For example, the system 500 may include two planarization apparatus. One planarization apparatus may be employed after the deposition unit 510B to planarize the layer of the Group IIIA material deposited in the deposition unit 510B, and another planarization apparatus may be employed after the deposition unit 510C to planarize the fully formed "Group IB material/planarized Group IIIA material/Group VIA material" stack to form a planarized precursor structure. In another example, the planarization apparatus may be employed only after the deposition unit 510B. In this case, a Group IB material layer is deposited in deposition unit 510A, a Group IIIA material layer is deposited in deposition unit 510B, a planarization step is carried out using the planarization apparatus, and then a Group VIA material layer is deposited on the planarized Group IIIA material layer forming the final precursor film, which we also call a planarized precursor structure. It should be noted that we refer to a precursor structure as "planarized precursor structure" if one or more layers within that structure is planarized in accordance with the teachings of this invention. For example, a Cu/In/Se stack or precursor structure would be called a planarized precursor structure if a planarization step is carried out; i) only after the Cu deposition step, ii) only after the In deposition step, iii) only after the Se deposition step, iv) both after the Cu deposition step and the In deposition step, v) both after the In deposition step and the Se deposition step, vi) both after the Cu deposition step and the Se deposition step, vii) after every deposition step, i.e. after the Cu deposition step, after the In deposition step and after the Se deposition step.

The planarization apparatus 508 may include one or more planarization means such as smooth surfaces that flattens the precursor structure 600A or any of its layers when pressed on it. In FIG. 5, planarized or flat precursor structure is denoted with the reference number 600B. In this respect the smooth surface may be one of a flat surface of a plate that may be pressed onto the precursor structure 600A, a surface of a roller that may be pressed and rolled on the precursor structure 600A or a surface of a sheet material pressed on the precursor structure 600A. As described in the above description, in one embodiment, smooth surfaces are the surfaces of rollers that are pressed onto the precursor structure 600A. In this embodiment, as an example and to show the order of the process steps, the planarization apparatus 508 is located after the process station 506 so that after the precursor structure 600A is formed, it is planarized by the planarization apparatus as the workpiece is moved in the direction of the arrow A. However, as explained above, a number of planarization apparatuses may be placed after the selected or all deposition units in the process station 506 to planarize the selected or all of the deposited layers of the precursor structure 600A, which may be in the form of a multi-layer stack. In one embodiment, the planarization apparatus 508 may be placed in a cleaning station 512 so that a cleaning fluid, such as DI water, is used to clean the deposited and or planarized layers thus provide a particle free environment to the planarization process. As explained above, this reduces defectivity in the planarized precursor structure. One or more cleaning units with or without the planarization apparatus 508 may be placed into the process station 506 after the selected or all of the deposition units.

The planarization apparatus may be heated by a heating system (not shown) to apply heat to the precursor structure or to any of its layers as it is planarized. The same may be achieved by heating the cleaning fluid in the cleaning chamber and applying this hot fluid to the precursor structure or to any of its layers to heat it. But, it should be noted that in this embodiment, the heat applied at this stage is not applied for reaction and formation of the Group IBIIIAVIA compound layer. Heat applied during planarization is relatively low (<200° C.) and mainly helps the planarization process itself by softening the precursor structure or any of its layers. This heat is not adequate to convert the precursor structure or its layers into a solar cell grade Group IBIIIAVIA compound semiconductor. Such reaction step is carried out on the planarized precursor structure at a later stage of the overall process.

Referring back to FIG. 5, in this embodiment, the planarization apparatus is a pair of rollers 514A and 514B, rotated and moved by a driving means, such as a motor. The upper roller 514A planarizes the precursor structure 600A when its smooth surface is pressed against the precursor structure 600A. As the upper roller 514A is pressed against the precursor structure 600A, the lower roller 514B presses against and supports a back surface 504B of the continuous workpiece 502. The rollers 514A and 514B may be made of various materials, such as stainless steel, hard plastics, etc. The rollers may be heated during the planarization process. The system 500 may also have other process stations such as a reaction chamber 516 to react the already planarized precursor structure to transform it fully or partially to a Group IBIIIAVIA thin film absorber layer as described above.

Figure 6A:
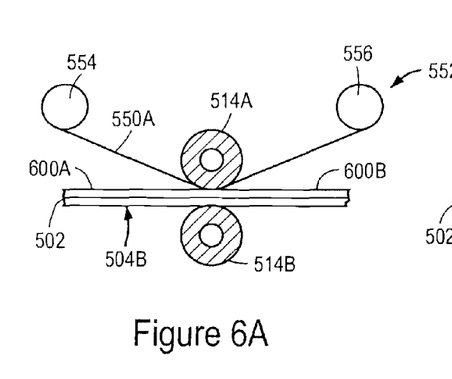
FIGS. 6A-6B shows alternative planarization means to use with the system shown in FIG. 5.

In one embodiment, the system 500 may include another planarization means or auxiliary planarization means which may or may not be used with the rollers 514A and 514B. As mentioned above, one example of such planarization means may be a surface of a flexible sheet material pressed against the precursor structure 600A to planarize it. An implementation of this embodiment can be seen in FIG. 6A which shows a flat sheet 550A placed between the surface of the precursor structure 600A and the roller 514A. During the process, the flat sheet 550A is also moved in the direction of the motion of the workpiece 502 with the same speed, while the upper roller 514A is pressed on the flat sheet and rotated on it. In this embodiment, the flat sheet may be a continuous flat sheet which is supplied and moved by a roll to roll flat sheet mechanism 552A. During the planarization process, unused flat sheet is fed from a flat sheet supply spool 554 and the used flat sheet is taken up and wrapped around a flat sheet receiving spool 556.

Figure 6B:
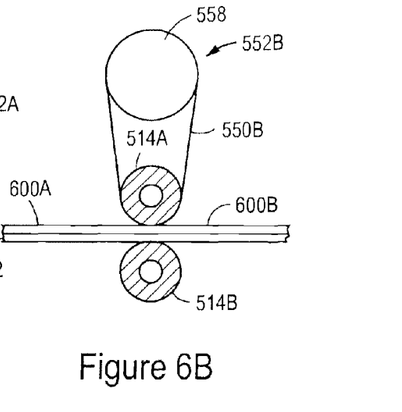

As shown in FIG. 6B a flat sheet 550B may be shaped as an endless loop and moved by an endless loop mechanism 552B to planarize the precursor structure 600A. The flat sheet 550B is retained in place by a spindle 558 and the upper roller 514A and moves or rotates about them as they are rotated. There may be another optional flat sheet between the lower roller 514B and the back surface 504B of the continuous workpiece 502. This flat sheet contacting the back surface may be driven by one of the mechanisms shown in FIGS. 6A-6B.

Figure 7:
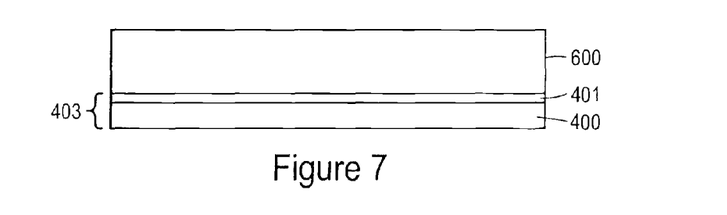
FIG. 7 is a schematic cross-sectional view of a CIGS layer formed after reaction of a precursor structure planarized in accordance with the present invention.

FIG. 7 shows the planar absorber layer 600C formed after reacting the planarized type II precursor structure 425 shown in FIG. 4D or the planarized type I precursor structure 403 depicted in FIG. 4C. Since the precursor structures in both cases are planarized, they yield Group IBIIIAVIA compound films or layers that are compositionally as well as structurally uniform. High efficiency solar cells may be fabricated on such compound films. It should be noted that the reaction step comprises heating the planarized precursor structures to a temperature range of 400-600° C., preferably in the presence of a Group VIA material which may be in vapor form or it may be already deposited over the planarized precursor structure before the step of heating, or it may be a constituent of the planarized precursor structure before the step of heating (such as the case for planarized type II precursor structure). Reaction typically takes 5-120 minutes depending on the temperature used.

In another embodiment, a precursor structure or layer may be planarized and reacted within a system, as described herein, that is used for reacting the precursor structure to transform it into a high quality solar cell absorber layer such as a high quality Group IBIIIAVIA compound film, in a continuous, roll-to-roll or reel-to-reel manner. In one embodiment, the system includes an elongated furnace or reactor including a planarization apparatus to planarize a precursor layer formed on a front surface of a base, which may be a continuous flexible base. As described in previous embodiments, the planarization apparatus may comprise two sets of rollers, comprising a set of upper rollers and a set of lower rollers. The rollers may be placed into a low temperature section or zone of a process gap of the reactor such that when the precursor structure or layer on the base is advanced within the low temperature section of the process gap, one or more upper rollers press onto the precursor layer and one more lower rollers support the base by pressing against a back surface of the base. The precursor layer comprises metallic phases.

In this embodiment as well, the processing or planarization of the precursor layer by the rollers or planarizers in the low temperature section forms a first planar layer during a planarization period, though there are differences in the embodiments as described hereinafter. The first planar layer preferably comprises a mixed-phase material having a first nonmetallic phase and a metallic phase. In the low temperature section, the precursor layer may be processed by the rollers in one of the following manners to form the first planar layer during the planarization period: (1) the precursor layer may be partially reacted while it is simultaneously planarized (in which case the first planar layer may be a mixed-phase layer comprising both metallic and non-metallic phases); (2) the precursor layer may first be partially reacted and then in a following step it may be planarized (in which case the first planar layer may be a mixed-phase layer comprising both metallic and non-metallic phases); (3) the precursor layer may be planarized without any appreciable reaction, in which case the first planar layer may be a layer comprising substantially only metallic phases. Once the first planar layer is formed by one of the three ways above, it is advanced into a high temperature zone. In the high temperature zone, the first planar layer is further reacted or fully reacted and transformed into a planar absorber layer which does not contain any metallic phases. This period of full reaction may be called a transformation period. The planar absorber layer obtained after the transformation period is made of a second nonmetallic phase, with no metallic phase present.

Figure 8A:
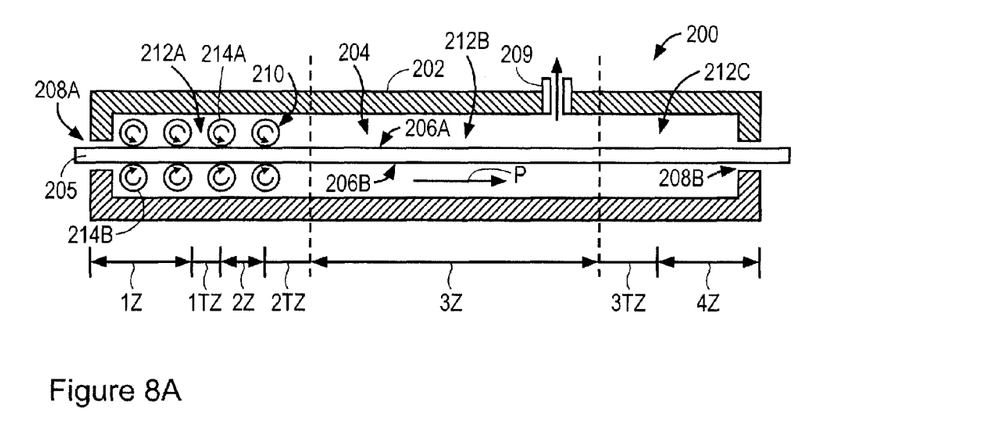
FIG. 8A is a schematic side view of an embodiment of a reactor including a planarization apparatus located within a process gap of the reactor.

FIG. 8A shows in side view an exemplary elongated continuous furnace or reactor 200 including peripheral reactor walls 202 and a process gap 204 defined by the peripheral reactor walls 202. A continuous workpiece 205 having a front surface 206A and a back surface 206B is advanced through the process gap 204 during the process. When advanced through the process gap 204, the continuous workpiece 205 is fed into the process gap 204 through an entrance opening 208A and exits the process gap 204 through an exit opening 208B. The front surface 206A of the continuous workpiece 205 includes a precursor material such as a precursor layer comprising Cu, In, Ga and optionally a Group VIA material such as Se and S. Unprocessed sections of the continuous workpiece 205, entering the process gap 204, may be unwrapped from a supply spool (not shown) and the processed portions, exiting the process gap 204, may be taken up and wound around a receiving spool (not shown), or other further processing may be performed on the processed portions.

During the process, inert gases such as nitrogen may be flowed into the process gap 204 through the entrance opening 208A and exit opening 208B and optionally through a gas inlet connected to the process gap 204. Used gases are removed from the process gap 204 through an exhaust opening 209. A planarization apparatus 210 is disposed within the process gap 204 and adjacent the entrance opening 208A. The planarization apparatus 210 may include the above described planarizers for pressing and flattening the precursor layer on the front surface 206A. In this embodiment, the planarization apparatus 210 comprises one or more upper rollers 214A to press onto the precursor layer on the front surface 206A, and one or more lower rollers 214B to support the back surface 206B of the continuous workpiece 205. It should be noted that it is possible to use a flat surface instead of the one or more lower rollers 214B. In this case planarization can be achieved by the one or more upper rollers 214A while the back surface 206B is supported by the flat surface (not shown). It is also possible to partially embed the lower rollers 214B, and/or the upper rollers 214A into the bottom peripheral reactor wall 202B and into the top peripheral reactor wall 202A, respectively, instead of placing them over such walls. Although a constant process gap 204 is shown in FIG. 8A, the process gap 204 may be varied in height between the entrance opening 208A and the exit opening 208B. For example, the bottom peripheral reactor wall 202B may be brought in contact with the back surface 206B of the continuous workpiece 205 within the zones 3Z, 3TZ and 4Z and thus the height of the process gap 204 may be lowered compared to its height within zones 1Z, 1TZ, 2Z and 2TZ.

Figure 8B:
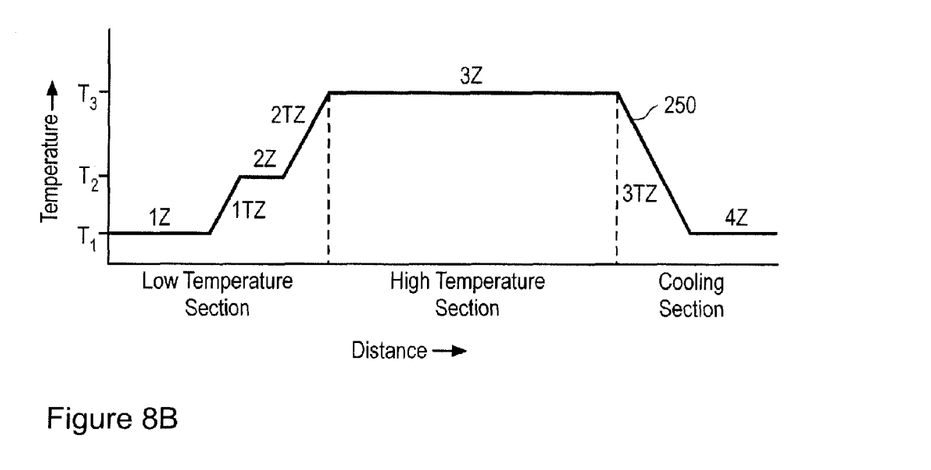
FIG. 8B is graph showing an exemplary temperature profile of the reactor shown in FIG. 8A.
Figure 8C:
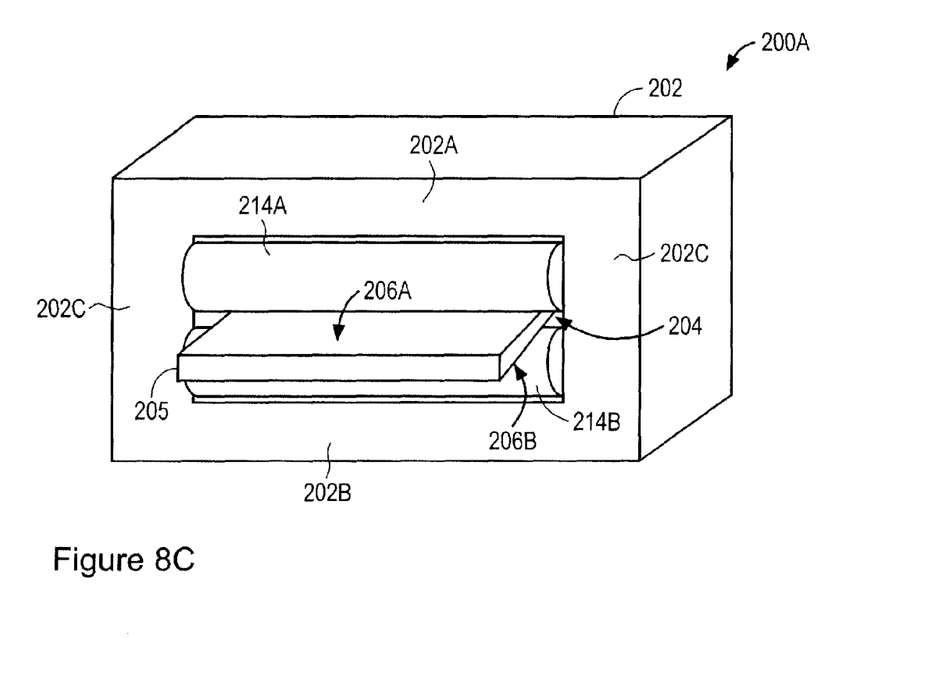
FIG. 8C is a schematic partial perspective view of the reactor with a portion of the planarization apparatus.

FIG. 8C shows the exemplary position of one of the upper rollers 214A and one of the lower rollers 214B, in relation with the continuous workpiece 205, within the process gap 204 in a portion 200A of the continuous reactor 200. As also shown in FIG. 8C, the peripheral reactor walls 202 of the reactor may comprise a top wall 202A, a bottom wall 202B, and the side walls 202C. Although not shown in FIGS. 8A and 8C, it is possible to have an insert within the cavity defined by the peripheral reactor walls 202. In this case the insert would have its own peripheral walls defining a process gap and the workpiece would move within that process gap. Such designs are discussed in our application Ser. No. 12/334,420 filed on Dec. 12, 2008 entitled Reactor to Form Solar Cell Absorbers, which application is expressly incorporated by reference herein.

Referring to FIGS. 8A and 8C, the peripheral reactor walls 202 may include cooling and heating elements to cool and heat the selected portions or sections of the peripheral reactor walls to establish a predetermined temperature profile or zones along the reactor. The heating and cooling elements may be placed into the walls or they may be placed outside the walls surrounding them. When the peripheral reactor walls 202 are heated, heat is transferred from the peripheral walls 202 into the process gap 204 where the workpiece 205 is advanced and processed. Approximate locations of the various exemplary temperature zones formed along the length of the process gap by the heating and cooling elements are marked on a reference line drawn below the system 200 in FIG. 8A. Furthermore, a graph 250 in FIG. 8B shows a temperature profile including these zones shown in FIG. 8A.

Accordingly, referring to FIGS. 8A and 8B, initially the workpiece is advanced through the entrance opening 208A into a first zone 1Z of the process gap 204, where the workpiece 205 is exposed to a first temperature range referred to as $T_1$ and is kept in the first temperature range while it is advanced in the process direction P. The first temperature may be in the range of 20-150° C., and can vary through the first zone 1Z as well. Next, the workpiece 205 is advanced into a second zone 2Z through a transition zone 1TZ or buffer zone. In the first transition zone 1TZ, the temperature of the workpiece 205 is increased from the first temperature range $T_1$ of the first zone 1Z to a second temperature range $T_2$ of the second zone 2Z. The second temperature range $T_2$ has preferably a temperature range that is higher than the temperature of the first temperature range $T_1$. The second temperature range may be 200-300° C. and can vary through the second zone 2Z as well. In the following step, the workpiece 205 is advanced into a third zone 3Z through a second transition zone 2TZ or second buffer zone. In the second transition zone 2TZ, the temperature of the workpiece 205 is increased from the second temperature range $T_2$ to a third temperature range $T_3$ of the third zone 3Z. The first zone 1Z, the first transition zone 1TZ, the second zone 2Z and the second transition zone 2TZ form a low temperature section 212A of the process gap 204.

As will be more fully described below, the planarization apparatus 210 is located within the low temperature section 212A of the process gap 204, and the planarization process is applied in the low temperature section 212A of the process gap 204 while the transformation of the precursor layer into an absorber layer is initiated at a portion of the workpiece, either before or right after the portion emerges from the planarization apparatus and continues to move towards the third zone 3Z where full reaction and transformation into an absorber layer is achieved. Within the low temperature section 212A, the planarization apparatus 210, i.e., the upper rollers 214A and lower rollers 214B, may be positioned near the entrance opening 208A or away from the entrance opening 208A, or they may be distributed along the low temperature section 212A. Throughout the third zone 3Z the workpiece 205 is exposed to the third temperature range $T_3$ which is higher than the first temperature range $T_1$ and the second temperature range $T_2$. The third temperature range $T_3$ may be in the range of 400-600° C. Although FIG. 8B shows a constant third temperature $T_3$, it is possible to have more than one temperature. For example, the temperature in the third zone 3Z may be near 400° C. near the second transition zone 2TZ and it may go up towards 500-600° C. range towards the end of the high temperature section 212B.

The third zone 3Z forms a high temperature section 212B of the process gap where the precursor layer is fully reacted and transformed into a compound absorber layer such as a Group IBIIIAVIA absorber layer, on which a high efficiency solar cell may later be fabricated. After the third zone 3Z, the workpiece is advanced into a fourth zone 4Z through a third transition zone 3TZ where the temperature of the workpiece is decreased from the third temperature to a temperature which is lower than or equal to the first temperature $T_1$. The third transition zone 3TZ and the fourth zone 4Z form a cooling section 212C of the process gap. The workpiece 205 leaves the fourth zone 4Z through the exit opening 208B. Details of the exemplary reactors for the formation of CIGS (S) type absorber layers on continuous workpieces can be found in the following patent application of the assignee of the present invention, which is incorporated herein by reference in its entirety: application Ser. No. 12/334,420 filed on Dec. 12, 2008 entitled Reactor to Form Solar Cell Absorbers.

Without a planarization process, when a precursor layer, including metallic species (which may be elemental forms or intermetallics or alloys of Cu, In, Ga) and optionally non-metallic Group VIA material species such as S, Se, is subjected to high temperature, and in some cases to gaseous species comprising Group VIA materials, Cu, In and Ga species react with each other and with the Group VIA material(s) and form first, intermetallic compounds and metal alloys (for example, $CuIn_2$, $CuGa_2$, $Cu(In,Ga)_2$, $Cu_{11}In_9$, $Cu_{11}(In,Ga)_9$, etc.) and binary or ternary selenide (or sulfide if sulfur is present) species (for example, various In—Se, Cu—Se, In—Ga—Se and Ga—Se alloys) and then eventually these metallic compounds and alloys further react with the binary selenides or sulfides and with the Group VIA materials forming the desired ternary or higher order Group IBIIIAVIA compound layers which may be used as solar cell absorbers. The reaction process is typically performed by increasing the temperature of the precursor layer from room temperature to a maximum temperature range of about 400-600° C. through a temperature profile while exposing it to an inert or Group VIA material containing atmosphere. As will be described below, the reaction process for the formation of planar compound layers is completed in two steps, the first step comprising planarization and possible partial reaction and second step comprising full reaction. To form a CIGS absorber layer, for example, the first step of the process is performed at low temperature, in the low temperature section 212A of the continuous reactor 200, and it includes planarization and conversion of the precursor layer into a planar mixed-phase layer. In a second process step, the planar mixed-phase layer is reacted in the high temperature section 212B of the continuous reactor 200 to form a planar compound layer.

The planar mixed-phase layer is a first film that comprises metallic phases such as Cu, In, Ga, Cu—In alloys, Cu—Ga alloys, In—Ga alloys, Cu—In—Ga alloys. The planar mixed-phase layer may further comprise at least one binary selenide phase selected from the group of Cu—Se, In—Se, and Ga—Se; at least one ternary selenide selected from the group of In—Ga—Se, Cu—In—Se, and Cu—Ga—Se; and even a quaternary selenide phase of Cu—In—Ga—Se. However, since planarization is carried out during the planarization period within the low temperature section of the reactor, it is preferred for the precursor layer or the planar mixed-phase layer to contain appreciable amount of the metallic phases. Therefore, it is preferred to have the metallic phases to constitute more than 25% (atomic percentage), more preferably more than 50%, and even more preferably more than 75% of the planar mixed-phase layer right before it emerges from the planarization apparatus. Since the workpiece moves relatively fast through the process gap (at a linear speed of at least 10 cm/minute, preferably more than 30 cm/min) this condition assures that there is appreciable amount of metallic phases in the planarizing precursor layer as it travels through the planarization apparatus during the planarization period. It should be noted that planarization is most effective on layers containing metallic species (such as Cu, In, Ga and their various alloys) that are pliable. Binary, ternary and quaternary selenides are brittle materials that cannot be deformed and, therefore, if they constitute 100% or a large percentage of the planarizing precursor layer, the planarization process mechanically breaks such brittle films giving rise to defectivity in the form of pinholes and cracks. The temperature range of the low temperature section 212A of the continuous reactor 200 is selected to pre-determine the relative amounts of the metallic and non-metallic (selenide or sulfide) phases in the planarizing precursor layer and the planar mixed-phase layer, with higher temperatures resulting in higher percentage of the non-metallic phases and lower temperatures favoring higher percentage of metallic species or phases.

The second step of the process involves full reaction of the planar mixed-phase layer and is performed at temperatures of 400° C. or higher in the high temperature section 212B of the continuous reactor 200 to convert the first film or the planar mixed-phase layer into a second film which does not contain any metallic phases. The second film is a substantially pure Group IBIIIAVIA compound layer such as a CIGS compound layer. It should be noted that the planar mixed-phase layer is not a solar cell grade film, i.e. solar cells with any appreciable conversion efficiency (such as an efficiency of 8% or more) cannot be fabricated on the planar mixed-phase layer. In fact, devices made on such layers show no photovoltaic response, i.e. they have 0% efficiency.

Referring back to FIGS. 8A and 8B, in one exemplary process sequence, in the low temperature section 212A, while the precursor layer is being planarized or flattened by the planarization apparatus 210, the precursor is partially reacted as the temperature profile shown in FIG. 8B is applied. During the planarization period and within the planarization apparatus the precursor layer is converted into a first film or a planar mixed-phase layer comprising metallic and non-metallic phases as described above. Presence of the metallic phases advantageously makes the heated precursor layer pliable, or flattenable or planarizable. Preferably, the planarization is applied to the precursor layer in the low temperature section 212A before its temperature rises to about 350° C., especially if there is a Group VIA material present in the precursor layer and/or in the environment of the reactor within the low temperature section 212A. This means that the planarization apparatus 210 is preferably placed in the section of the low temperature section 212A where the temperature is below about 350° C. More preferably the planarization apparatus 210 is placed in a portion of the low temperature section 212A where the temperature is below about 300° C., even more preferably below about 250° C. By staying below the 250-350° C. temperature range through the planarization period, presence of a metallic phase in the layer may be assured even right before the last roller in the planarization apparatus 210 applies force to the planarizing precursor layer. After the planarization process is completed (i.e. after the planarization period) the temperature within the low temperature section 212B may go higher, and the metallic content of the planar mixed-phase layer may reduce to below the preferred 25% range, since it is not critical any more for the layer to be pliable or planarizable. It should, however, be noted that if there is no Group VIA material in the precursor layer, if there is no gaseous Group VIA materials in the process gap, or if there is only a small amount of Group VIA material in the precursor layer and/or in the process gap (i.e. not enough to convert the precursor layer completely into the brittle selenide or sulfide phases), the planarization process may be applied at temperatures of even above 350° C. since the presence of metallic phases in the precursor layer is assured in this case even at high temperatures.

It should be noted that the planarization methods described herein may be applied in various other forms. For example, the process may be applied to a flexible continuous workpiece with the precursor layer facing down instead of up. Additional rollers may be included in the process gap wherein these additional rollers may not apply planarization force to the workpiece but they may be used to avoid scratching of the back side or the front side of the workpiece by the top and bottom reactor walls in case the process gap is made very narrow, for example with a height in the 2-5 mm range. The temperature profile in FIG. 8B may also have more temperature steps. More than one workpiece may be simultaneously planarized and reacted in a reactor design where more sets of rollers may be placed in stacked fashion in the low temperature section of the reactor.

Although the present invention is described with respect to certain preferred embodiments, modifications thereto will be apparent to those skilled in the art.

What is claimed is:

1. A method of forming a thin film solar cell absorber layer, comprising:
   providing a base having a front surface and a back surface;
   depositing a precursor layer over the front surface of the base, wherein the precursor layer includes metallic species comprising at least one Group IB material and at least one Group IIIA material;
   converting the precursor layer into a planar layer during a planarization period by applying force onto a top surface of the precursor layer by a smooth surface of a planarization apparatus to press down and flatten the precursor layer without removing any material from the precursor layer, wherein a first temperature range is provided within a first process section of a reactor that contains the planarization apparatus; and
   reacting the planar layer at a second temperature range for a transformation period within a second process section that is different from the first process section of the reactor to transform the planar layer into a planar Group IBIIIAVIA compound layer, the second temperature range being greater than the first temperature range.

2. The method of claim 1, wherein the first temperature range is selected such that at least 25 atomic percent of the planar layer is made of the metallic species at the end of the planarization period.

3. The method of claim 1, wherein the first temperature range is less than 350° C. and the second temperature range is more than 400° C.

4. The method of claim 3, wherein the first temperature range is below 250° C.

5. The method of claim 3 wherein the precursor layer further includes a Group VIA material.

6. The method of claim 3 further including the step of providing a gaseous Group VIA material to at least one of the first process section and the second process section during at least one of the planarization period and the transformation period.

7. The method of claim 5 wherein the precursor layer includes Cu, In, Ga and Se.

8. The method of claim 1 wherein the step of converting results in the planar layer having a surface roughness of less than or equal to 50 nm.

9. The method of claim 8 wherein the step of converting flattens the Group IIIA material in the precursor layer.

10. The method of claim 1 wherein the step of converting results in the planar layer having a surface roughness of less than or equal to 20 nm.

11. The method of claim 10 wherein the step of converting flattens the Group IIIA material in the precursor layer.

12. The method of claim 1 wherein the step of converting flattens the Group IIIA material in the precursor layer.

13. The method of claim 1 wherein the planarization apparatus includes an upper roller and a lower roller.

14. The method of claim 13, wherein the step of converting the precursor layer into a planar layer is conducted by a rolling process by applying the upper roller onto the top surface of the precursor layer and the lower roller to the back surface of the base.

15. The method of claim 14, further comprising placing a flat sheet between the top surface of the precursor layer and the upper roller and applying force to the flat sheet to flatten the top surface of the precursor layer.

16. A method of forming a thin film solar cell absorber layer on a continuous base having a front surface over which a precursor layer is deposited and a back surface, the method comprising;
   feeding a portion of the continuous base into an elongated reactor through an entry opening from a supply spool;
   converting a segment of the precursor layer over the front surface of the portion of the continuous base into a planar layer segment during a planarization period by applying force onto a top surface of the precursor layer by a smooth surface of a planarization apparatus to press down and flatten the precursor layer without removing any material from the precursor layer, wherein a first temperature range is provided within a first process section of the elongated reactor that contains the planarization apparatus as the portion of the continuous base is moved through the first process section;

reacting the planar layer segment at a second temperature range for a transformation period within a second process section that is different from and adjacent to the first process section of the elongated reactor to transform the planar layer segment into a planar compound layer segment as the portion of the continuous base is moved through the second process section; and taking up the planar compound layer segment to a receiving spool, while the steps of feeding converting and reacting continue on other portions of the continuous base.

17. The method of claim 16 further including the steps of cooling down and moving the portion of the base with the planar compound layer segment out of the elongated reactor through an exit opening of the elongated reactor, and wherein the second temperature range is greater than the first temperature range.

18. The method of claim 17 wherein the first temperature range is 20-350° C., the second temperature range is 400-600° C. and the planar compound layer is a Group IBIIIAVIA compound layer.

19. The method of claim 18 wherein a gaseous Group VIA material is provided to at least one of the first process section and the second process section during at least one of the planarization period and the transformation period.

20. The method of claim 16 wherein the step of converting results in the planar layer having a surface roughness of less than or equal to 50 nm.

21. The method of claim 20 wherein the step of converting flattens the Group IIIA material in the precursor layer.

22. The method of claim 16 wherein the step of converting results in the planar layer having a surface roughness of less than or equal to 20 nm.

23. The method of claim 16 wherein the step of converting flattens the Group IIIA material in the precursor layer.

24. The method of claim 16 wherein the planarization apparatus includes an upper roller and a lower roller.

25. The method of claim 24, wherein the step of converting the segment of the precursor layer over the front surface of the portion of the continuous base into a planar layer segment is conducted by a rolling process by applying the upper roller onto the top surface of the precursor layer and the lower roller to a back surface of the continuous base.

26. The method of claim 25, further comprising placing a flat sheet between the top surface of the precursor layer and the upper roller and applying force to the flat sheet to flatten the top surface of the precursor layer.

* * * * *